(12) United States Patent
Leenders et al.

(10) Patent No.: US 6,741,329 B2
(45) Date of Patent: May 25, 2004

(54) LITHOGRAPHIC APPARATUS AND DEVICE MANUFACTURING METHOD

(75) Inventors: Martinus Hendrikus Antonius Leenders, Rotterdam (NL); Johannes Hubertus Josephina Moors, Helmond (NL); Erik Roelof Loopstra, Heeze (NL); Noud Jan Gilissen, Eindhoven (NL); Markus Franciscus Antonius Eurlings, Tilburg (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/235,854

(22) Filed: Sep. 6, 2002

(65) Prior Publication Data

US 2003/0063266 A1 Apr. 3, 2003

(30) Foreign Application Priority Data

Sep. 7, 2001 (EP) .............................................. 01307613

(51) Int. Cl.$^7$ ........................ G03B 27/42; G03B 27/54; G03B 27/72
(52) U.S. Cl. .............................. 355/53; 355/67; 355/71
(58) Field of Search ............................. 355/53, 67, 77, 355/71; 430/30

(56) References Cited

U.S. PATENT DOCUMENTS

| | | | |
|---|---|---|---|
| 5,437,946 A | 8/1995 | McCoy | 430/5 |
| 6,013,401 A | 1/2000 | McCullough et al. | 430/30 |
| 6,081,319 A * | 6/2000 | Ozawa et al. | 355/67 |

FOREIGN PATENT DOCUMENTS

| | | |
|---|---|---|
| EP | 0 720 056 A2 | 7/1996 |
| EP | 0 720 056 A3 | 9/1996 |
| JP | 04080760 | 3/1992 |
| JP | 11026379 | 1/1999 |
| JP | 11219893 | 8/1999 |

* cited by examiner

*Primary Examiner*—Peter B. Kim
(74) *Attorney, Agent, or Firm*—Pillsbury Winthrop LLP

(57) ABSTRACT

An illumination intensity adjustment device includes a plurality of blades disposed in the projection beam so as to cast half-shadows extending across the illumination field. The blades can be selectively rotated to increase their width perpendicular to the projection beam to control uniformity.

19 Claims, 6 Drawing Sheets

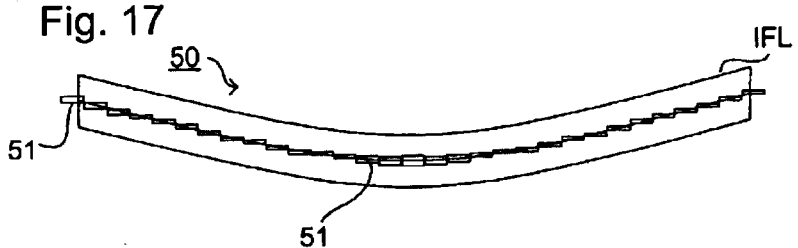
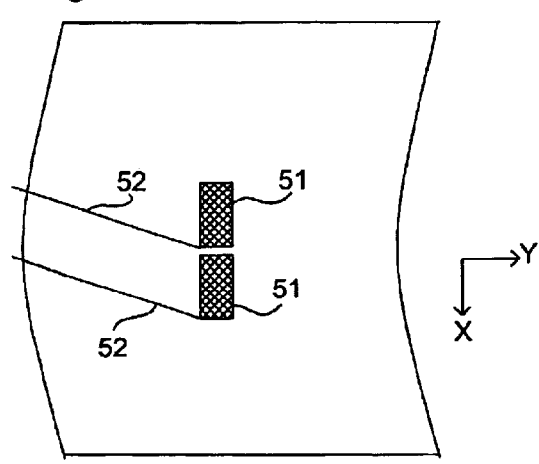
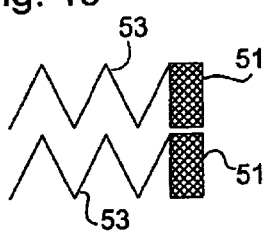
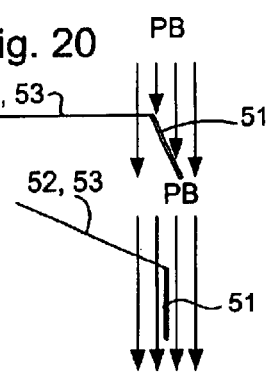
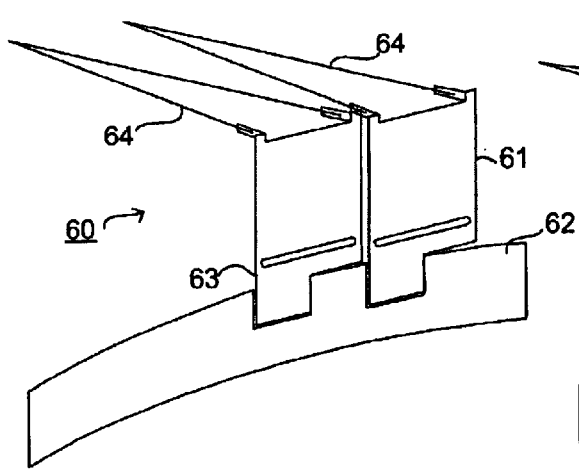
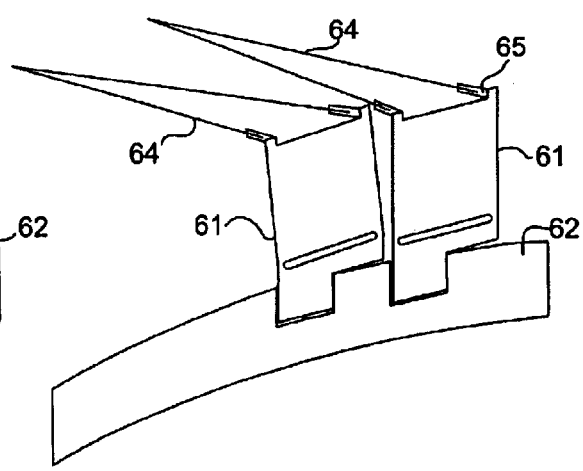

LITHOGRAPHIC APPARATUS AND DEVICE MANUFACTURING METHOD

BACKGROUND OF THE INVENTION

1. Field of the Invention

The present invention relates to a lithographic projection apparatus.

2. Description of the Related Art

The term "patterning device" as here employed should be broadly interpreted as referring to device that can be used to endow an incoming radiation beam with a patterned cross-section, corresponding to a pattern that is to be created in a target portion of the substrate. The term "light valve" can also be used in this context. Generally, the pattern will correspond to a particular functional layer in a device being created in the target portion, such as an integrated circuit or other device (see below). An example of such a patterning device is a mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

Another example of a pattering device is a programmable mirror array. One example of such an array is a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind. In this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuators. Once again, the mirrors are matrix-addressable, such that addressed mirrors will reflect an incoming radiation beam in a different direction to unaddressed mirrors. In this manner, the reflected beam is patterned according to the addressing pattern of the matrix-addressable mirrors. The required matrix addressing can be performed using suitable electronics. In both of the situations described hereabove, the patterning device can comprise one or more programmable mirror arrays. More information on mirror arrays as here referred to can be seen, for example, from U.S. Pat. Nos. 5,296,891 and 5,523,193, and PCT publications WO 98/38597 and WO 98/33096. In the case of a programmable mirror array, the support structure may be embodied as a frame or table, for example, which may be fixed or movable as required.

Another example of a pattering device is a programmable LCD array. An example of such a construction is given in U.S. Pat. No. 5,229,872. As above, the support structure in this case may be embodied as a frame or table, for example, which may be fixed or movable as required.

For purposes of simplicity, the rest of this text may, at certain locations, specifically direct itself to examples involving a mask and mask table. However, the general principles discussed in such instances should be seen in the broader context of the patterning device as hereabove set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once. Such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally<1), the speed V at which the substrate table is scanned will be a factor M times that at which the mask table is scanned. More information with regard to lithographic devices as here described can be seen, for example, from U.S. Pat. No. 6,046,792.

In a known manufacturing process using a lithographic projection apparatus, a pattern (e.g. in a mask) is imaged onto a substrate that is at least partially covered by a layer of radiation-sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

For the sake of simplicity, the projection system may hereinafter be referred to as the "lens." However, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel or preparatory steps may be carried out on one or more tables while one or more other tables are being used for exposures. Dual stage lithographic apparatus are described, for example, in U.S. Pat. No. 5,969,441 and WO 98/40791.

An important determinant of imaging quality in a lithographic apparatus is uniformity of the dose delivered to the substrate surface. If there are variations in the energy density delivered at wafer level across the imaged area this can lead to variations in the size of image features after development of the resist. Uniformity at wafer level can be ensured to a high degree by ensuring that the illumination field (slit) at mask level is uniformly illuminated. This can be achieved by passing the illumination beam through an integrator such as a quartz rod, within which the beam will undergo multiple reflections, or a fly's eye lens, which creates a multiplicity of overlapping images of the source. A fly's eye lens, or its equivalent, can be made in both refractive and reflective optics but may still leave some residual non-uniformity in intensity across the illumination field.

U.S. Pat. Nos. 6,013,401 and 5,895,737 describe step-and-scan apparatus having an arrangement for controlling the illumination intensity along the length of a rectangular illumination field that is perpendicular to the scanning direction. The device comprises a plurality of linked blades arrayed along one edge of the illumination field or slit. The blades are selectively inserted into the slit to reduce its effective width so that the effective slit width can be varied along its length. By reducing the effective slit width at positions where the illumination energy density is relatively high, a more uniform illumination of the mask and hence a more uniform dose at substrate level can be obtained while scanning. However, this arrangement introduces telecentricity problems because it causes asymmetric filling of the pupil of the projection system and shifts the center of gravity of the illumination beam. Also, the sliding mechanisms are a potential source of contamination, which is particularly undesirable in an EUV apparatus which must be maintained at a vacuum.

SUMMARY OF THE INVENTION

It is an aspect of the present invention to improve local control of the illumination dose.

This and other aspects are achieved according to the invention in a lithographic apparatus including a radiation system constructed and arranged to supply a projection beam of radiation; a support structure constructed and arranged to support a patterning device, the patterning device constructed and arranged to pattern the projection beam according to a desired pattern; a substrate table constructed and arranged to hold a substrate; a projection system constructed and arranged to project the patterned beam onto a target portion of the substrate; a positioning device constructed and arranged to move the substrate relative to the projection system in at least a scanning direction; an intensity adjustment device disposed in the radiation system and comprising a plurality of members which, in use, cast penumbras on an illumination field on the patterning device, the penumbras being substantially symmetric in the scanning direction about a center line of the illumination field.

By ensuring that the penumbras are substantially symmetric in the scanning direction about the center line of the illumination field, the introduction of any telecentricity errors can be avoided or minimized. The effect of absorption of energy from the beam on one side of the illumination field is counterbalanced by a corresponding absorption of energy from the other side of the field. Thus, it is not essential that the penumbras be mirror or rotationally symmetric about the center line of the illumination field, rather that the energy absorbed at a distance y from the center line on one side is equal to the energy absorbed at a distance y from the center line on the other side. It is also not necessary that the penumbra cast by each member be symmetric; the sum of the penumbras cast by two or more members may be symmetric, one member compensating for another. It will be appreciated that if the projection system involves mirrors, then the direction at the patterning device corresponding to the scanning direction of the substrate may not be parallel to the scanning direction. In that case, the symmetry requirement on the penumbras should be understood as being in the direction corresponding to the scanning direction.

It will be appreciated that symmetry may be provided by ensuring the penumbras extend across the illumination field, or by centrally placed penumbras, or by penumbras extending inwards from both sides of the illumination field. Because the effect on telecentricity is greater if radiation is blocked at the edges of the field than in the center, the symmetry requirements are less rigid for penumbras in a central region of the slit.

Preferably, the members of the intensity adjustment device according to the invention are selectively adjusted to manipulate their penumbras on the patterning device. By making the members adjustable, a dynamic adjustment of dose is possible to compensate for changing conditions of the apparatus, illumination settings or pattern being imaged. In an embodiment, the members are blades which are rotated to alter their effective width in a direction perpendicular to the projection beam and thus change the amount of radiation in the projection beam which is intercepted.

The penumbras of the adjustable members can be arranged to extend across the illumination field (slit) on the patterning device (mask) at a slight angle (preferably equal to the pitch of the members divided by the field width) in order that adjustment of their width does not introduce telecentricity problems. Although the intensity of the beam is locally varied by such adjustment, this variation is symmetric across the width of the illumination field. The intensity adjustment device of the invention can also be used for adjustment of dose across the whole illumination field.

The intensity adjusting device of the present invention may be used to correct for non-uniformities in the intensity of the projection beam in the illumination field and variations in the reflectivity or transmissivity of the patterning means. Blades in areas where the intensity of the illumination beam is relatively high, or reflectivity/transmissivity relatively high, are inclined to block a greater proportion of the radiation of the projection beam. The intensity adjusting device can also be used to correct line-width variations caused by other effects by the use of user-defined dose profiles.

In a scanning apparatus, the intensity adjusting device of the invention can be used to effect control over the illumination beam intensity on a fine grid. To do this, the rotational positions of the blades are controlled in synchronism with the scan. Such a control over the illumination beam intensity can be used to compensate for pattern dependent effects, such as near-angle and far-field stray light in dense portions of a pattern or portions with a small non-reflective area on a reflective background. This stray light causes a local increase in background intensity at the substrate which would increase the total dose locally and cause line width variations since the resist is sensitive to total dose received. The intensity adjusting device of the invention can be used to compensate for this.

According to a further aspect of the invention there is provided a device manufacturing method comprising providing a substrate that is at least partially covered by a layer of radiation-sensitive material; providing a projection beam of radiation using a radiation system; using a patterning device to endow the projection beam with a pattern in its cross-section; projecting the patterned beam of radiation onto a target portion of the layer of radiation-sensitive material while moving the substrate in at least a scanning direction; disposing in the projection beam upstream of the patterning device an intensity adjusting device comprising a plurality of members arranged to cast penumbras on an illumination field on the patterning device, the penumbras being substantially symmetric in the scanning direction about a center line of the illumination slit.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. One of ordinary skill in the art will appreciate that, in the context of such alternative applications, any use of the terms "reticle", "wafer" or "die" in this text should be considered as being replaced by the more general terms "mask", "substrate" and "target portion", respectively.

In the present application, the terms "radiation" and "beam" are used to encompass all types of electromagnetic radiation, including ultraviolet radiation (e.g. with a wavelength of 365, 248, 193, 157 or 126 nm) and extreme ultra-violet radiation (EUV), (e.g. having a wavelength in the range 5–20 nm).

BRIEF DESCRIPTION OF THE DRAWINGS

Embodiments of the invention will now be described, by way of example only, with reference to the accompanying schematic drawings in which:

FIGS. 16 and 17 are plan views of an intensity adjustment device of a fifth embodiment of the invention with all blind members open and with some blind members partially closed;

FIG. 18 is an enlarged plan view of two blind members of the device of FIGS. 16 and 17 showing supporting beams;

FIG. 19 is a plan view of two blind members of the fifth embodiment with a variant form of supporting beam;

FIG. 20 shows the effect of tilting blind members in the fifth embodiment;

FIGS. 21 and 22 are perspective views of two blind members of a sixth embodiment of the invention, with one blind member tilted in FIG. 22;

In the Figures, corresponding reference symbols indicate corresponding parts.

DETAILED DESCRIPTION

Figure 1:
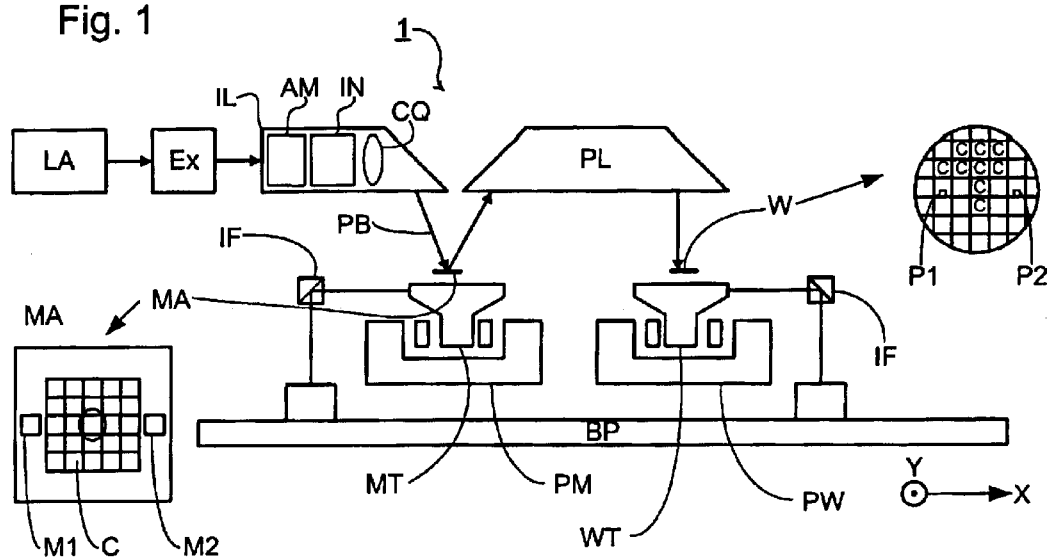
FIG. 1 depicts a lithographic projection apparatus according to a first embodiment of the invention.

FIG. 1 schematically depicts a lithographic projection apparatus 1 according to an embodiment of the invention. The apparatus includes a base plate BP; a radiation system Ex, IL constructed and arranged to supply a projection beam PB of radiation (e.g. EUV radiation), which in this particular case also comprises a radiation source LA; a first object table (mask table) MT provided with a mask holder that holds a mask MA (e.g. a reticle), and connected to a first positioning device $M_1$, $M_2$ that accurately positions the mask with respect to a projection system PL; a second object table (substrate table) WT provided with a substrate holder that holds a substrate W (e.g. a resist-coated silicon wafer), and connected to a second positioning device $P_1$, $P_2$ that accurately positions the substrate with respect to the projection system PL; the projection system ("lens") PL (e.g. a mirror group) constructed and arranged to image an irradiated portion of the mask MA onto a target portion C (e.g. comprising one or more dies) of the substrate W.

As here depicted, the apparatus is of a reflective type (i.e. has a reflective mask). However, in general, it may also be of a transmissive type, for example (with a transmissive mask). Alternatively, the apparatus may employ another kind of patterning device, such as a programmable mirror array of a type as referred to above.

The source LA (e.g. a discharge or laser-produced plasma source) produces a beam of radiation. This beam is fed into an illumination system (illuminator) IL, either directly or after having traversed a conditioning device, such as a beam expander Ex, for example. The illuminator IL may comprise an adjusting device AM that sets the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors). This latter scenario is often the case when the source LA is an excimer laser. The present invention encompasses both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning device $P_1$, $P_2$ and interferometer IF, the substrate table WT can be moved accurately, e.g., so as to position different target portions C in the path of the beam PB. Similarly, the first positioning device $M_1$, $M_2$ can be used to accurately position the mask MA with respect to the path of the beam PB, e.g., after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed.

Figure 2:
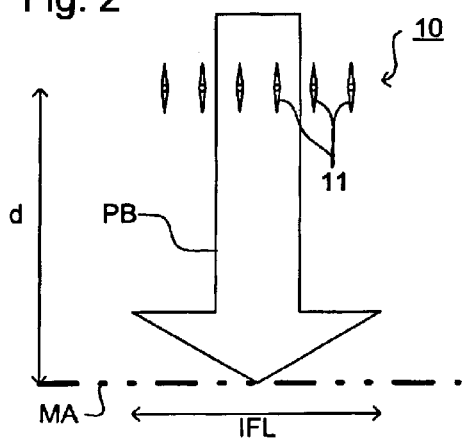
FIGS. 2 and 3 are respectively side and top plan views of an intensity adjustment device used in the first embodiment of the invention with its blades at the maximally open position.
Figure 3:
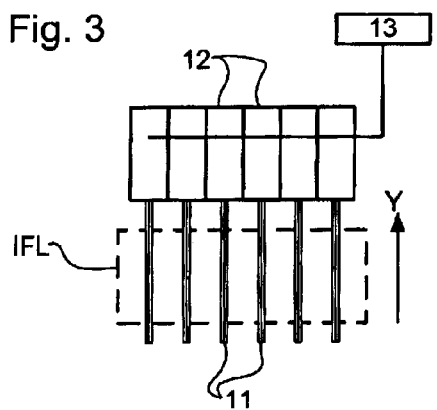

The depicted apparatus can be used in two different modes:

1. In step mode, the mask table MT is kept essentially stationary, and an entire mask image is projected at once, i.e. a single "flash", onto a target portion C. The substrate table WT is then shifted in the X and/or Y directions so that a different target portion C can be irradiated by the beam PB;

In scan mode, essentially the same scenario applies, except that a given target portion C is not exposed in a single "flash". Instead, the mask table MT is movable in a given direction (the so-called "scan direction", e.g., the Y direction) with a speed v, so that the projection beam PB is caused to scan over a mask image. Concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution. As illustrated in FIGS. 2 and 3, the intensity adjustment device 10 of the present invention comprises a plurality of blades 11 disposed in the illumination system IL in the path of the projection beam PB. The intensity adjustment device 10 is situated at an optical distance d from the mask MA, or a plane conjugate with the mask MA, such that they are out of focus at mask level and also not in a pupil plane of the radiation system. In general, the intensity adjustment device should be closer to the mask, or a conjugate plane thereof, than to a pupil plane. If the radiation system contains an intermediate image plane, the blades may be positioned closer to that than to a pupil plane. In an illumination system utilizing field and pupil facet mirrors to provide uniformity, the intensity adjusting device may be positioned before the field facet mirrors.

The blades 11 extend across the projection beam so that their half shadows extend across the width of the illumination field IFL (along the scanning direction of the apparatus), substantially perpendicular to its longitudinal axis. The blades are spaced apart a distance such that their half shadows at mask level are overlapping (though it may be sufficient that they are adjacent) and must be sufficient in number so that their half shadows cover the entire illumination field. The shadow profiles of the blades tail-off and the tail portions overlap. Rotating the blades, to increase their effective widths, darkens their shadow profiles. Actuators 12 are positioned to selectively rotate respective ones of the blades.

Figure 4:
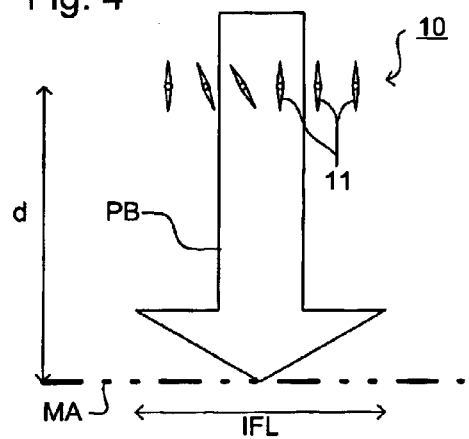
FIGS. 4 and 5 are views corresponding to FIGS. 2 and 3 but with two blades partially inclined.
Figure 5:
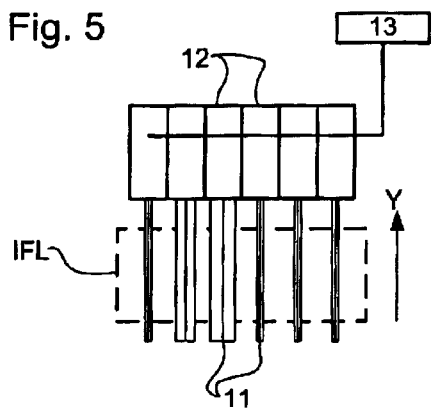

As shown in FIGS. 4 and 5, rotation of one of the blades 11 from the maximally open position shown in FIGS. 2 and 3, causes its effective width in the projection beam to increase, thereby blocking a greater portion of the incident radiation. Preferably, the blades are made of a material absorbent of the radiation of the projection beam so as to minimize scattered stray light (or have an anti-reflection coating). Accordingly, the angle of inclination of individual ones of the blades 11 can be adjusted to absorb a greater portion of incident radiation in regions of the beam where the incident intensity is higher so increasing uniformity of illumination. The angle of the blades can be varied to reduce the intensity in the half shadow by up to about 10% without unduly effecting telecentricity. In this text, it should be noted that the degree of inclination shown in FIG. 4 has been exaggerated for clarity. It will further be appreciated that the number of blades shown in FIGS. 2 to 5 is considerably less than there would be in practice. For a blade disposed at 64 mm from the mask in an apparatus with NA=0.25 and σ=0.5 using EUV, the radius of shadow at wafer level is 0.5 mm so that about 60 blades would be used to cover an illumination field of length 30 mm, for example. In another apparatus, e.g. using DUV radiation, the stand-off distance may be a factor of 4 or 5 less.

It will also be appreciated that the exact shape of the blades is not crucial to the invention, however the blades should be made as thin as possible to provide minimum obscuration at their maximally open position. The width of the blades should be determined in accordance with the accuracy of the actuators 12 to provide the desired degree of controllability over the amount of radiation absorbed.

The actuators 12 may be, for example, piezo-electric actuators or any other suitable rotary actuator. A linear actuator driving the rods via a gear arrangement is also possible.

The intensity adjustment device 10 of the present invention may fulfil four functions.

In a first mode, the intensity adjustment device 10 is used to correct for undesired non-uniformities in the projection beam provided by the illumination system. When used in this way, such uniformities can be measured by an appropriate sensor or by calibration runs. The appropriate blade angles to achieve the desired uniformity correction are then calculated and the actuators 12 controlled to effect this by controller 13. The uniformity of the projection beam is then re-measured at appropriate intervals to detect any time varying non-uniformities and the blade angles adjusted as necessary. For this function the speed of response of the blade actuators is not crucial but the actuators should preferably be designed so that the blade positions can be maintained for relatively long periods without the need for constant energization of the actuators.

In a second mode, the blades can be used to correct for stray light effects that are pattern or machine dependent. Of necessity, masks for use with EUV radiation are reflective and suffer from a problem that a relatively high proportion of the radiation that is desired to be blocked is scattered as stray light rather than absorbed. This is a particular problem in dense areas of the mask pattern where a large amount of stray light is generated. The stray light may be projected onto the substrate raising the background illumination level in the dense pattern areas. The illumination correction device 10 according to the invention can therefore be used to reduce the illumination intensity on areas of the pattern, such as dense areas, that suffer badly from stray light. In this mode, the positions of the blades 11 must be controlled in synchronism with the scanning of the mask pattern so that the blades adjust to the desired position as the illumination field IFL scans over the pattern areas for which a correction is necessary. It will be appreciated that this mode of the invention can be used in combination with the first mode, with the blade positions necessary to provide uniform illumination forming a baseline to which corrections for stray light are added.

In a third mode, the overall dose is controlled by rotating all of the blades by the same amount. Again, a rotation of all of the blades may be superimposed on selective rotations of some blades for non-uniformity control and pattern-dependent effects according to the first and second modes. If of sufficient width, the blades may be used to completely block the projection beam and thus provide a means of switching off the source. This mode allows the light source to be operated at a constant intensity, with desired intensity adjustments being effected by the intensity correction device, which significantly improves the source lifetime. If the intensity adjustment device is only to be used in this mode, it may be located in or near a pupil plane of the illumination system rather than near the mask, or a conjugate plane thereof. Of course, multiple intensity adjustment devices may be provided at different positions in the illumination system and operated in different modes.

In a fourth mode, critical dimension variations across the mask are corrected. The structures on the reticle have predetermined nominal dimensions to correspond to the desired dimensions of the imaged features. However, since the dimensions of developed features are also dependent on the resist threshold and the total dose, any local deviations in the mask from the nominal dimensions can be corrected for using the intensity adjustment device according to the invention. This mode can of course be used in conjunction with corrections according to the other modes.

To put into practice one or more of the above modes of operation, the lithographic apparatus is provided with a suitably programmed controller. The controller is supplied, as necessary for the different modes, with information on the non-uniformities in the projection beam provided by a suitable sensor and/or information on the mask pattern, e.g. the density of lines in different areas and the deviation of feature dimensions such as line widths from their nominal values.

It will of course be appreciated that since the intensity reduction is not linear with blade angle, where several corrections are to be applied together, the desired total intensity correction should be determined and then the necessary blade angle(s) determined.

Additionally, the density and crossing angle (orientation in the XY plane) of the blades may be changed dynamically or statically.

In a second embodiment of the invention, which is generally the same as the first embodiment of the invention save as described below, wires are used instead of blades in the intensity correction device.

Figure 6:
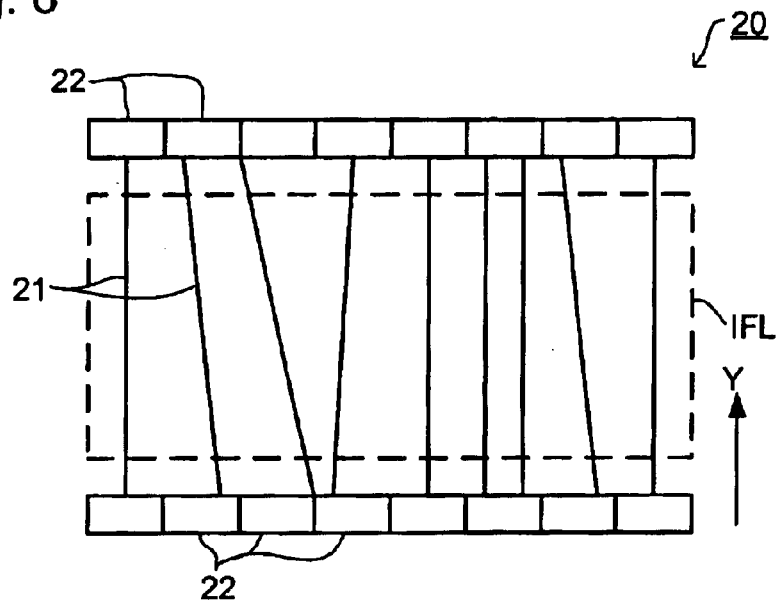
FIG. 6 is a plan view of an intensity adjustment device in a second embodiment of the invention.

FIG. 6 shows the intensity adjustment device 20 according to the second embodiment. This device comprises a plurality of wires 21 extending across the projection beam so that their half shadows extend across the illumination field IFL generally parallel to the scanning (Y) direction. A slight angle to the scanning direction, approximately equal to the pitch of the wires divided by the width of the illumination field, is preferred for complete avoidance of telecentricity errors. The ends of the wires are held in respective mounts 22 on opposite sides of the beam. In some cases more than one wire may extend between a pair of mounts. As in the first embodiment, the wires are out of focus at mask level and will scaler or absorb a proportion of the projection beam leading to a local intensity reduction.

The intensity adjustment device 20 of the second embodiment may be used in a static mode in which the positions and orientations of the wires are set to correct for any static systematic intensity variations. Where the wires are close together, their half shadows will overlap to increase the intensity reduction.

Alternatively, the mounts 22 at one or both sides may be provided with actuators to move the positions of the ends of the wires. The enables a dynamic control of the intensity of the projection beam at mask level and the intensity correction device 20 may then be used to effect the first, second and fourth modes of the first embodiment.

It will further be appreciated that the present invention can be adapted to non-rectangular illumination fields, e.g. arcuate illumination fields. Also, the blades or wires may be disposed along the length of the slit or in an arbitrary direction perpendicular to the projection beam, e.g. in a non-scanning apparatus.

Figure 7:
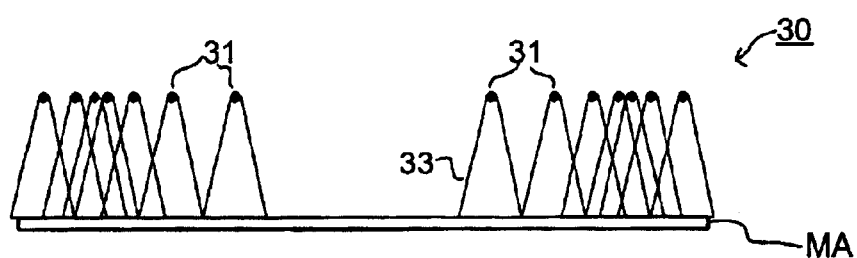
FIG. 7 is a side view of an intensity adjustment device in a third embodiment of the invention.
Figure 8:
FIG. 8 is a graph of intensity with position across the illumination field in the third embodiment of the invention, with the intensity adjustment device set as shown in FIG. 7.
Figure 9:
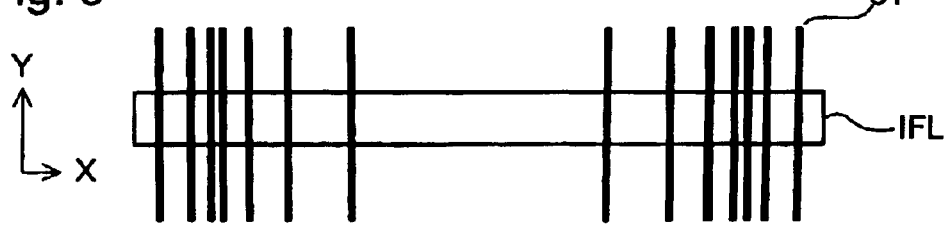
FIG. 9 is a plan view of the intensity adjustment device of FIG. 7.

In a third embodiment of the invention, which is generally the same as the second embodiment of the invention save as described below, the wires are selectively positionable and removable from the projection beam. FIG. 7 shows the intensity correction device 30 which comprises a plurality of wires 31 each individually and selectively positionable within the projection beam so as to cast a penumbra 33 onto the mask MA. The intensity distribution resulting from the arrangement of wires in FIG. 7 is shown in FIG. 8. It will be seen that this has dips in intensity corresponding to the regions where the wires 31 are closest together. FIG. 9 is a plan view showing that the wires 31 extend across the width of the illumination field IFL generally perpendicular to the scanning direction Y. Note that as in the first embodiment it may be preferable that the wires 31 make a slight angle to the scanning direction Y.

Figure 10:
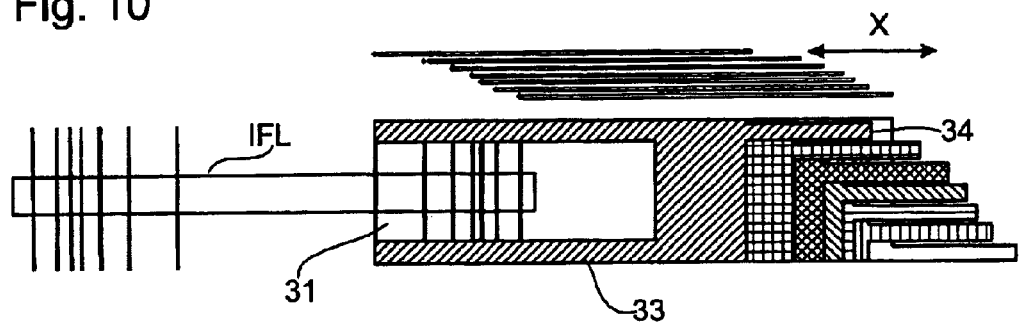
FIG. 10 is a view similar to FIG. 9 additionally showing a mechanism for positioning the wires of the intensity adjustment device of FIG. 7.

A mechanism for positioning the wires 31 is shown in FIG. 10 which shows the mechanism in plan and also in a side view. The mechanism for only one half of the wires is shown; a corresponding mechanism will be positioned on the other side of the illumination field IFL. In this mechanism, each of the wires 31 is connected across the end of a generally U-shaped frame 33 which extends parallel to the illumination field IFL. A tab 34 extending from the base of each frame 33 is connected to an actuator (not shown) such that each wire may be individually positioned within the beam. The range of movement of each actuator should be such that all of the wires 31 can be removed to positions where their penumbras do not fall on the illumination field IFL if desired.

Figure 11:
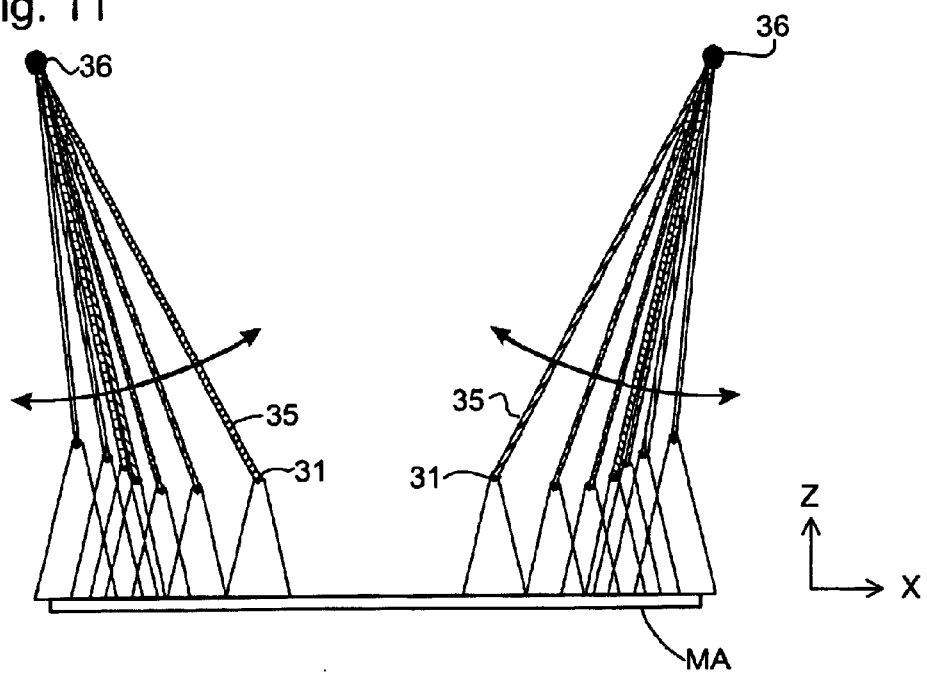
FIG. 11 is a view similar to FIG. 7 additionally showing an alternative mechanism for positioning the wires of the intensity adjustment device of FIG. 7.

FIG. 11 shows a variant mechanism for positioning the wires 31. Again, the wires 31 are connected between the ends of generally U-shaped frames 35 but in the case the frames 35 are connected to pivots 36 positioned outside the projection beam so that they may be swung into the projection beam as indicated by the arrows. The frames 35 may be sized so that they nest within one another while still remaining outside the projection beam.

Figure 12:
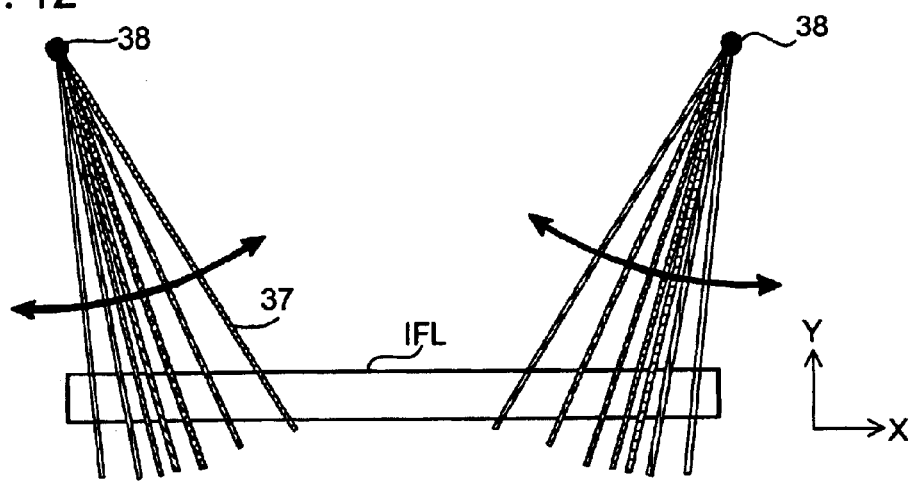
FIG. 12 is a plan view of an intensity adjustment device in a variant of the third embodiment.

FIG. 12 illustrates a further variant of the third embodiment in which the wires 37 are stiffer so as to form self-supporting cantilevers and are mounted on pivots 38 to one side of the projection beam. The wires are then selectively pivoted as indicated by the arrows to bring them into the projection beam.

Figure 13:
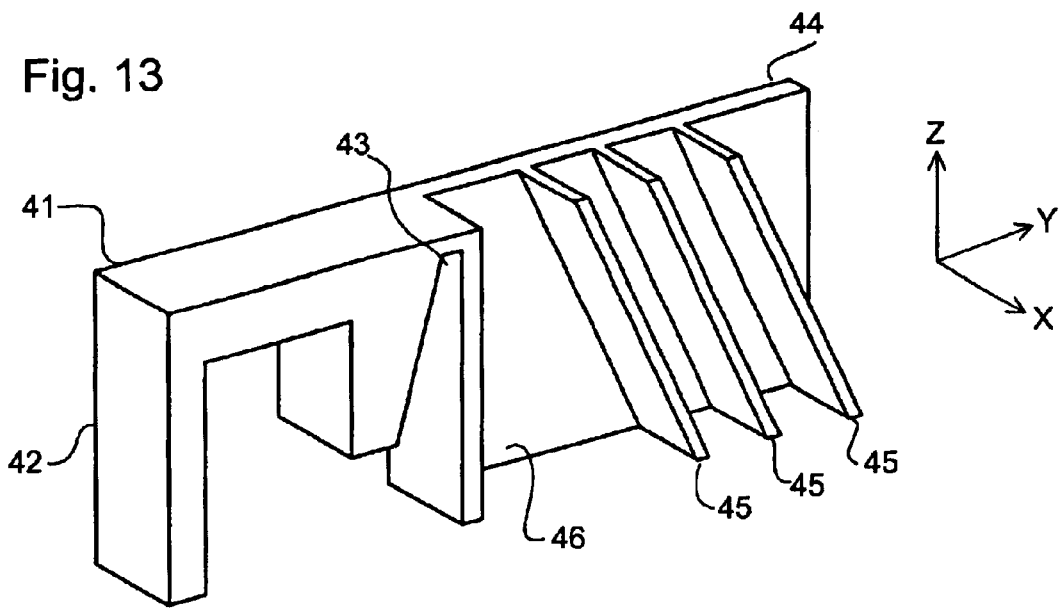
FIG. 13 is a perspective view of a finned member in an intensity adjustment device of a fourth embodiment of the invention.
Figure 14:
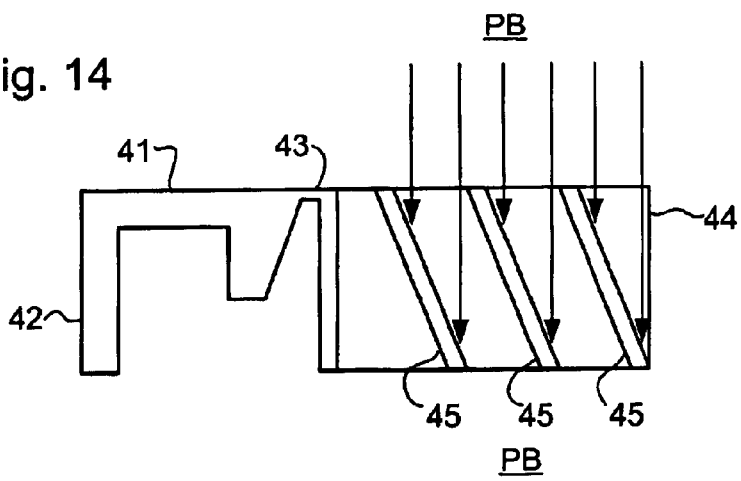
FIGS. 14 and 15 are side views of the finned member of FIG. 13 in closed and open positions respectively.
Figure 15:
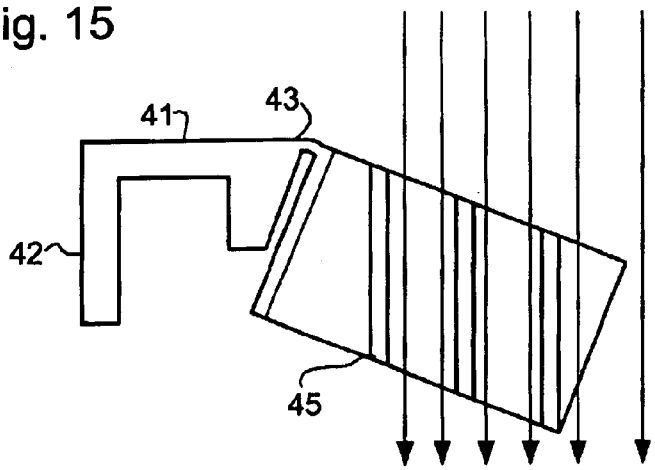

In a fourth embodiment of the invention, which is generally the same as the first embodiment save as described below, the intensity adjustment device comprises a plurality of finned members 41 arranged adjacent each other and parallel to the scanning direction Y. As shown in FIG. 13, each of the finned members 41 comprises a mounting portion 42 joined via a hinge portion 43 to a finned portion 44. The finned portion 44 carries a plurality, in this example three, of fins 45 which are disposed at an angle to the direction of propagation of the projection beam Z. As shown in FIG. 14, when the finned member 41 is in its relaxed position, the spacing and angle of the fins 45 is such that the projection beam PB is totally blocked. However, when the finned member 41 is flexed about its hinge 43 by an actuator (not shown) the fins 45 can be rotated to a position at which the beam is minimally intercepted. The finned member therefore allows the transmission to be controlled between 0% and nearly 100%. A suitable actuator such as a voice coil or a piezoelectric actuator can allow any desired degree of control between these two extremes. The fin support 46 and the fins 45 are made as thin as possible to minimize the intensity lost at the maximally open position. It is also possible to have one large fin, in which case much or all of the fin support 46 may be dispensed with.

The finned members 41 can easily be made from a solid block of material, e.g. by spark erosion. A linear actuation is converted to a rotational movement and requires only a short movement, allowing high speed operating, e.g. allowing gray scale adjustment during a scan. The parallel arrangement creates a simple layout for actuator cabling and mounting.

In a fifth embodiment of the present invention the effect on telecentricity is minimized by positioning adjustable blind members in the center part of the illumination field IFL in the scanning direction Y. This is illustrated in FIGS. 16 and 17 which show a plurality of blind members 51 constituting the intensity adjustment device 50 positioned along the center line of a curved illumination field IFL. In FIG. 17 some of the blind members 51 in the middle and left-hand side of the drawing are tilted to increase their effective width in the scanning direction and hence the amount of radiation blocked.

FIG. 18 shows two blind members 51 with supporting beams 52 which extend from the side of the illumination field IFL. The beams 52 extend at an angle so that the dose integrated in the Y direction is constant for all X positions. FIG. 19 shows an alternative supporting arrangement in which the beams 53 are zigzagged. FIG. 20 then shows how the blinds 51 are tilted between partly closed, in the top view, and fully open, in the bottom view, positions.

Note that where the intensity profile of the illumination field in the Y direction is non-uniform, the width of the beams 52, 53 may be varied along their lengths to compensate.

A sixth embodiment, shown in FIGS. 21 to 25, is similar to the fifth embodiment in positioning blind members along the center of the slit but differs in the form of the blinds and their support structure.

Figure 23:
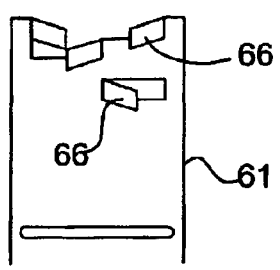
FIG. 23 is a side view of a variant of a blind member of the sixth embodiment.
Figure 24:
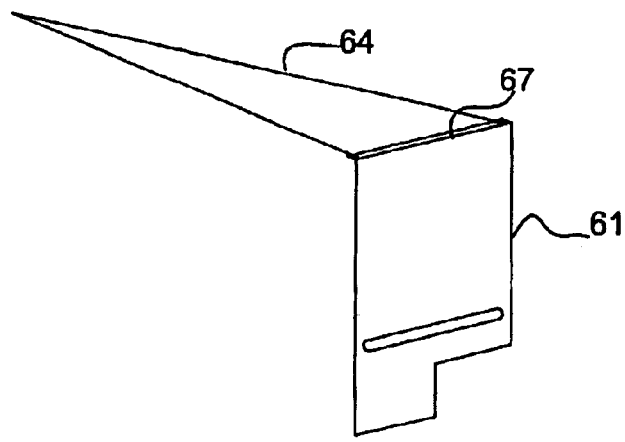
FIG. 24 is a perspective view of a further variant of a blind member of the sixth embodiment.
Figure 25:
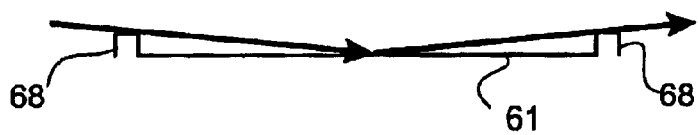
FIG. 25 is a view showing blocking of radiation reflected at grazing incidence by a blind member in the sixth embodiment.

In the sixth embodiment, the blind members 61 are supported by a curved rib 62 which runs along the center line of the illumination field IFL. The blind members 61 have a hinge 63 formed by cut-outs near the rib 62 and are attached to wires 64 which extend to actuators (not shown) at the side of the projection beam. The blind member is thus tilted into the projection beam to increase the amount of radiation blocked, as shown in FIG. 22. To minimize the potential uniformity errors introduced by absorption by the wires 64, they are arranged to extend diagonally across the projection beam and to be as thin as possible. The tabs 65 to which the wires 64 are connected may also cause uniformity errors and to compensate for this dummy tabs 66 may be provided across the width of the blinds 61, as shown in FIG. 23. FIG. 24 shows an alternative arrangement for connection of the wires 64 in which a flange 67 extends across the entire width of the blind 61. This also serves to block radiation that might be undesirably reflected at grazing incidence by the blind 61.

Since the blinds 61 are arranged generally parallel to the projection beam, when tilted into it radiation will be incident on the blinds 61 at grazing incidence. The radiation incident on the blinds 61 may therefore be reflected rather than absorbed. Accordingly, ribs or folds 68 are provided at the ends of the blind 61 such that radiation is only reflected if it is at a sufficiently large angle to the blind that it will be reflected out of the pupil of the projection lens. Small ribs or ridges may be provided across the whole width of the blind. The closer together the ribs are positioned, the less high they need be.

In a seventh embodiment (not illustrated) the members of the intensity adjustment device comprise a plurality of members arranged along the sides of the illumination field perpendicular to the scanning direction. The members are mounted on respective arms so as to be rotatable about axes perpendicular to the scanning direction to vary the extent to which they project into the projection beam. This has advantages over the sliding movement known in the prior art as the mechanism is simpler and has less sliding metal-metal contact that might be a source of particulate contamination.

While specific embodiments of the invention have been described above, it will be appreciated that the invention may be practiced otherwise than as described. The description is not intended to limit the invention.

We claim:

1. A lithographic projection apparatus comprising:
   a radiation system constructed and arranged to supply a projection beam of radiation;
   a support structure constructed and arranged to support a patterning device, the patterning device constructed and arranged to pattern the projection beam according to a desired pattern;
   a substrate table constructed and arranged to hold a substrate;
   a projection system constructed and arranged to project the patterned beam onto a target portion of the substrate;
   a positioning device constructed and arranged to move the substrate relative to the projection system in at least a scanning direction;
   an intensity adjustment device disposed in the radiation system and comprising a plurality of members which, in use, cast penumbras on an illumination field on the patterning device, the penumbras being substantially symmetric in the scanning direction about a center line of the illumination field; and
   a mechanism constructed and arranged to selectively adjust ones of the members to manipulate their penumbras.

2. An apparatus according to claim 1 wherein the plurality of members cast elongate penumbras that extend substantially parallel to the scanning direction across the illumination field.

3. An apparatus according to claim 1, wherein the plurality of members comprise a plurality of blades, effective widths of the blades in a direction perpendicular to the projection beam being individually variable.

4. An apparatus according to claim 3 wherein the blades are individually rotatable so as to vary their effective widths.

5. An apparatus according to claim 1, wherein the plurality of members comprises a plurality of wires.

6. An apparatus according to claim 5, further comprising a mechanism constructed and arranged to selectively position ones of the wires so that their penumbras fall at selected positions within the illumination fields.

7. An apparatus according to claim 6, wherein the mechanism to selectively position is further constructed and arranged to position ones of the wires outside the projection beam.

8. An apparatus according to claim 6, wherein the mechanism to selectively position comprises U-shaped frames, each U-shaped frame holding a wire, the U-shaped frames being translatable or rotatable to position the wires.

9. An apparatus according to claim 5, wherein the wires extend as cantilevers from a pivot about which they are rotatable to be positioned.

10. An apparatus according to claim 1, wherein each of the members comprises a support extending substantially parallel to the scanning direction and at least one fin depending from the support, the support being pivotable about an axis perpendicular to the scanning direction from a first position in which the fin is substantially parallel to the direction of propagation of the projection beam and a second position at which the fin is at an acute angle to the projection beam.

11. An apparatus according to claim 1, wherein each of the members comprises a blind member located to cast a penumbra in a central part of the illumination field and being rotatable to vary its effective area in the projection beam.

12. Apparatus according to claim 11, wherein the blind members are supported by a mechanism extending from outside the projection beam, the beams not being parallel to the scanning direction.

13. An apparatus according to claim 11, wherein the blind members are hingedly mounted on a beam extending generally along a center line of the illumination field.

14. An apparatus according to claim 1, wherein the intensity adjustment device is positioned in the radiation system closer to an image plane or a plane conjugate to an image plane than to a pupil plane.

15. A device manufacturing method, comprising:
providing a substrate that is at least partially covered by a layer of radiation-sensitive material;
providing a projection beam of radiation using a radiation system;
using a patterning device to endow the projection beam with a pattern in its cross-section;
projecting the patterned beam of radiation onto a target portion of the layer of radiation-sensitive material;
disposing in the projection beam upstream of the patterning device an intensity adjusting device comprising a plurality of members arranged to cast penumbras on an illumination field on the patterning device, the penumbras being substantially symmetric in a scanning direction about a center line of the illumination field; and
selectively adjusting ones of the members to manipulate their penumbras.

16. A method according to claim 15, further comprising detecting any non-uniformities in the intensity of the projection beam and wherein the selectively adjusting is carried out to reduce the non-uniformities.

17. A method according to claim 15, wherein the using of the patterning device comprises scanning a pattern across the projection beam and the selectively adjusting comprises adjusting ones of the members during the scanning to reduce the intensity of the projection beam in predetermined areas of the pattern.

18. A method according to claim 15, wherein the using of the patterning device comprises scanning a pattern across the projection beam and further comprising determining variations in the dimensions of features in the pattern from nominal values and wherein the selectively adjusting comprises adjusting ones of the members in synchronism with the scanning of the pattern to compensate for the variations in the dimensions of the features.

19. A device manufactured according to the method of claim 15.

* * * * *